(12) United States Patent
Tsai et al.

(10) Patent No.: US 6,694,466 B1
(45) Date of Patent: Feb. 17, 2004

(54) METHOD AND SYSTEM FOR IMPROVING THE TEST QUALITY FOR SCAN-BASED BIST USING A GENERAL TEST APPLICATION SCHEME

(75) Inventors: Huan-Chih Tsai, Sunnyvale, CA (US); Kwang-Ting Cheng, Santa Barbara, CA (US); Sudipta Bhawmik, Monmouth Junction, NJ (US)

(73) Assignee: Agere Systems Inc., DE (US)

( * ) Notice: Subject to any disclaimer, the term of this patent is extended or adjusted under 35 U.S.C. 154(b) by 0 days.

(21) Appl. No.: 09/428,242

(22) Filed: Oct. 27, 1999

(51) Int. Cl.[7] .............................................. G01R 31/28
(52) U.S. Cl. ...................................... 714/729; 714/728
(58) Field of Search ................................ 714/726, 728, 714/729

(56) References Cited

U.S. PATENT DOCUMENTS

| | | | |
|---|---|---|---|
| 5,173,906 A | * 12/1992 | Dreibelbis et al. | 714/733 |
| 5,448,166 A | * 9/1995 | Parker et al. | 324/158.1 |
| 5,450,414 A | * 9/1995 | Lin | 714/726 |
| 5,510,704 A | * 4/1996 | Parker et al. | 324/158.1 |
| 5,524,114 A | * 6/1996 | Peng | 714/724 |
| 5,592,493 A | * 1/1997 | Crouch et al. | 714/729 |
| 5,636,227 A | * 6/1997 | Segars | 714/729 |
| 5,663,967 A | * 9/1997 | Lindberg et al. | 714/737 |
| 5,748,497 A | * 5/1998 | Scott et al. | 702/181 |
| 5,991,909 A | * 11/1999 | Rajski et al. | 714/729 |
| 6,148,425 A | * 11/2000 | Bhawmik et al. | 714/726 |
| 6,327,685 B1 | * 12/2001 | Koprowski et al. | 714/733 |

OTHER PUBLICATIONS

C.-J. Lin, Y. Zorian and S. Bhawmik, "PSBIST: A partial–scan based built–in self–test scheme", IEEE Proceedings International Test Conference, Oct. 17–21, 1993, Page(s).: 507–516.*

S. Narayanan, R. Gupta and M.A. Breuer, "Optimal configuring of multiple scan chains", IEEE Transactions on Computers, vol.: 42 Issue: 9, Sep. 1993, Page(s).: 1121–1131.*

Cheng, Kwang–Ting and Lin, Cheh–Jen, Timing–Driven Test point Insertion for Full–Scan and Partial–Scan BIST, IEEE 1995.*

Narayanan, S. and Das, A. "An efficient scheme to diagnose scan chains"; Proceedings International Test Conference, 1997, pp.: 704–713.*

Agrawal et al, "A Tutorial on Built–in Self–Test, Part 2: Applications", *IEEE Design & Test of Computers*, vol. 10, No. 22, pp. 69–77, Jun. 1993.

Lin et al, "Integration of Partial Scan and Built–In Self–Test", *Jetta*, vol. 7, No. 1–2, pp. 125–137, Aug. 1995.

Tamarapalli et al, "Constructive Multi–Phases Test Point Insertion for Scan–Based BIST", *Proc. of ITC*, pp. 649–658, Oct. 1996.

Tsai et al., "An Almost Full–scan BIST Solution—Higher Fault Coverage and Shorter Test Application Time", *Proc. of ITC*, pp. 1065–1073, Oct. 1998.

(List continued on next page.)

*Primary Examiner*—Albert Decady
*Assistant Examiner*—Joseph D. Torres
(74) *Attorney, Agent, or Firm*—Steve Mendelsohn; Yuri Gruzdkov

(57) ABSTRACT

A general test application scheme is proposed for existing scan-based BIST architectures. The objective is to further improve the test quality without inserting additional logic to the Circuit Under Test (CUT). The proposed test scheme divides the entire test process into multiple test sessions. A different number of capture cycles is applied after scanning in a test pattern in each test session to maximize the fault detection for a distinct subset of faults. A procedure is presented to find the optimal number of capture cycles following each scan sequence for every fault. Based on this information, the number of test sessions and the number of capture cycles after each scan sequence are determined to maximize the random testability of the CUT.

19 Claims, 4 Drawing Sheets

OTHER PUBLICATIONS

Cheng et al, "Timing–Driven Test Point Insertion for Full–Scan and Partial–Scan BIST", *Proc. of ITC*, pp. 506–514, Oct. 1995.

Tsai et al, "A Hybrid Algorithm for Test Point Selection for Scan–Based NBIST" *Proc. of DAC*, pp. 478–483, Jun. 1997.

Bardell, "Design Considerations for Parallel Pseudorandom Pattern Generators", Feb. 1990, vol. 1:200–204.

Pomeranz, "3–weight Pseudo Random Test Generation Based on a Deterministic Test Set for Comb. and Sequential Circuits", Jul. 1993, vol. 24:1050–1058.

Konemann et al., "Built in Logic Observation Technique", 1979, Digest of Papers of 1979 Test Con.: 3.

Bardell et al., "Self–Testing of Multichip Logic Modules", 1982, 1982 IEEE Test Conference, Paper 9.3.

Bershteyn, "Calculation of Multiple Sets of Weights for Weighted Random Testing", International Test Conference 1993, Paper 45.3.

Zorian, "Programmable Space Compaction for BIST", pp. 340–349.

Waicukauski et al., "Fault Detection Effectiveness of Weighted Random Patterns", 1988 International Test Conference, Paper 15.2:245–255.

Kapur et al., "A Weighted Random Pattern Generation System"; IEEE Trans. on Computer–Aided Design of Integrated Circuits and Systems, vol. 15:1020–1025.

* cited by examiner

FIG. 2
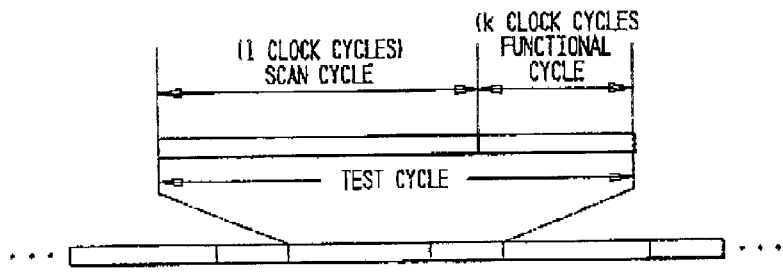
FIG. 3
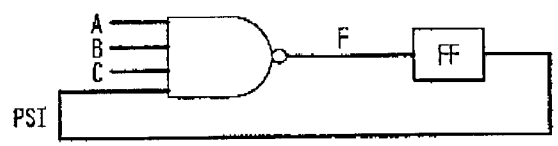
FIG. 4A
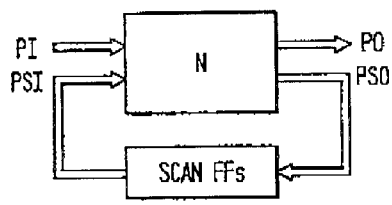
FIG. 4B
| PHASE | CYCLE | cntl(PI) | cntl(PSI) | obs(PO) | obs(PSO) |
|---|---|---|---|---|---|
| 1 | 1st~(l-1)th | 0.5 | 0.5 | 1.0 | 0.0 |
| 2 | lth | 0.5 | 0.5 | 1.0 | obs(PSI) IN NEXT CLOCK CYCLE |
| 3 | (l+1)th~(l+k-1)th | 0.5 | cntl(PSO) IN PREVIOUS CLOCK CYCLE | 1.0 | obs(PSI) IN NEXT CLOCK CYCLE |
| 4 | (l+k-1)th | 0.5 | cntl(PSO) IN PREVIOUS CLOCK CYCLE | 1.0 | 1.0 |

METHOD AND SYSTEM FOR IMPROVING THE TEST QUALITY FOR SCAN-BASED BIST USING A GENERAL TEST APPLICATION SCHEME

BACKGROUND OF THE INVENTION

1. Field of the Invention

A method and system are described for improving the test quality of a scan-based BIST.

2. Description of Related Art

The test schemes for scan-based BIST can be classified as either test-per-clock or test-per-scan, see V. D. Agrawal, C. R. Kime, and K. K. Saluja, "A Tutorial on Built-In Self-Test, Part 2: Applications," *IEEE Design & Test of Computers*, vol. 10, no. 22, pp. 69–77, June 1993. In test-per-clock BIST, a test vector is applied and its response is compressed every clock cycle. The examples of test-per-clock BIST are BILBO-based design, see B. Konemann, J. Mucha, and C. Zwiehoff, "Built-In Logic Block Observation Technique," *Digest of Papers* 1979 *Test Conf.*, pp. 37–41, October 1979 and circular BIST, see Krasniewski and S. Pilarski, "Circular Self-Test Path: A Low-Cost BIST Technique for VLSI Circuits," *IEEE Trans. on CAD*, vol. 8, no. 1, pp. 46–55, January 1989. In test-per-scan BIST, a test vector is applied and its response is captured into the scan chains only after the test is scanned into the scan chains. The well-known STUMPS architecture, see P. H. Bardell and W. H. McAnney, "Self-Testing of Multichip Logic Modules," *Digest of Papers* 1982 *Int'l Test Conf.*, pp. 200–204, November 1982, falls into this category. There are tradeoffs between these two test application schemes in terms of area overhead, performance degradation, and test application time. The test-per-clock BIST typically has shorter test time but incurs higher area and performance overheads than test-per-scan BIST.

SUMMARY OF THE INVENTION

PSBIST is proposed to incorporate partial-scan and pseudo-random testing into the scan-based BIST, see C.-J. Lin, Y. Zorian, and S. Bhawmik, "Integration of Partial Scan and Built-In Self-Test," *JETTA*, vol. 7, no. 1–2, pp. 125–137, August 1995. The test application scheme of PSBIST is a combination of test-per-clock BIST and test-per-scan BIST. It results in shorter test time without increasing the area and performance overheads comparing to the conventional test-per-scan BIST. This work is based on the PSBIST architecture. Unlike PSBIST (or any other test-per-scan BIST) which always applies a single capture cycle after scanning in a new test pattern, it is proposed to apply multiple capture cycles after each scan sequence. It has been observed that applying a different number of capture cycles per scan can help to detect a different subset of faults. A general test application scheme is now proposed—multiple test sessions with a unique number of capture cycles per scan in each session—for PSBIST. A procedure of finding the optimal parameters (i.e. the number of test sessions and the number of capture cycles per scan in each session) of the test scheme for a given circuit is described in detail. The proposed scheme has been implemented and experimented on ISCAS89 benchmark circuits using an industrial scan-based BIST system, psb2. The results presented at the end of this detailed description illustrate the effectiveness of the proposed approach.

BRIEF DESCRIPTION OF THE DRAWINGS

FIG. 2 illustrates the entire test procedure including an expanded version of one test cycle.

FIG. 3 is a schematic diagram of the different signal probability profile at PSI.

FIG. 4A illustrates the input and output of a scan circuit.

FIG. 4B illustrates the computing testability of the scan circuit of FIG. 4A for one test cycle.

DETAILED DESCRIPTION OF THE INVENTION

A. PSBIST

Figure 1:
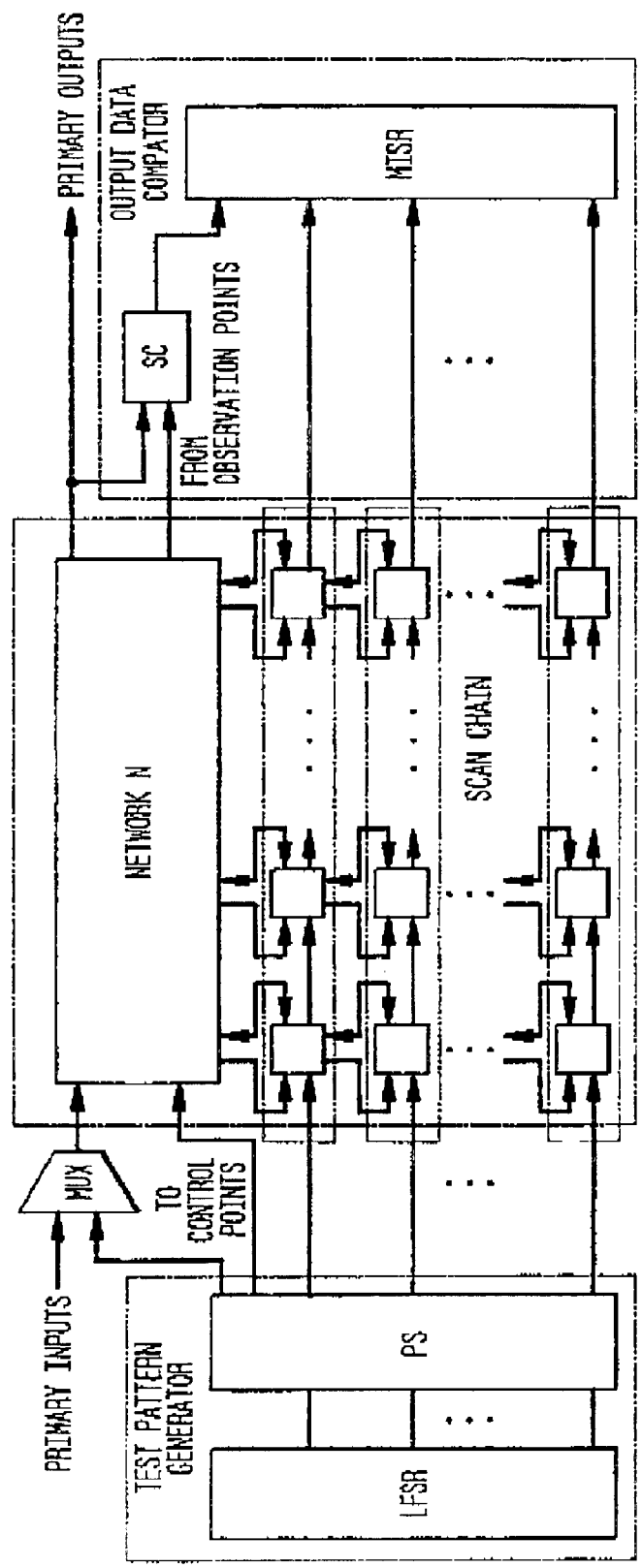
FIG. 1 is a schematic diagram of a PSBIST architecture as used according to the preferred embodiment of the invention.

FIG. 1 is the schematic of PSBIST which is similar to STUMPS, see P. H. Bardell and W. H. McAnney, "Self-Testing of Multichip Logic Modules," *Digest of Papers* 1982 *Int'l Test Conf.*, pp. 200–204, November 1982. The BIST capability are incorporated into the circuit through the following steps:

a) Replace crucial flip-flops with scan flip-flops, then connect them into the scan chains. For full-scan BIST, all flip-flops are replaced; for partial-scan BIST, the crucial flip-flops are defined as those, if scanned, that will remove all sequential loops with length greater than one.

b) Optionally, add test points (control points or observation points) to increase the random testability of the circuit.

c) Add a Test Pattern Generator (TPG) add an Output Data Compactor (ODC). The TPG consists of a Linear Feedback Shift Register (LFSR) and a Phase Shifter (PS). The PS is used to avoid the structure dependency among the outputs of TPG, see P. H. Bardell, "Design Considerations for Parallel Pseudo-Random Pattern Generators," *JETTA*, vol. 1, pp. 73–87, February 1990. The ODC consists of a Multiple Input Signature Register (MISR) and a Space Compactors (SC), see Y. Zorian and A. Ivanov, "Programmable Space Compaction for BIST," *Proc. of Int'l Symp. on Fault-Tolerant Computing*, pp. 340–349, June 1993.

During the test, the patterns are continuously applied to the network N from the primary inputs and through the scan chains. The responses at the primary outputs are compressed by the MISR every clock cycle which is similar to the test-per-clock scheme. However, the responses are captured into the scan chains only after a new test pattern is scanned in, and then compressed by the MISR when they are scanned out. This is similar to the test-per-scan BIST. By doing so, the desired fault coverage can be reached earlier than the conventional test-per-scan approach without extra hardware.

B. Additional Important Factors

Several techniques have been developed to improve the test quality of pseudo random testing. Among them, weighted random testing uses multiple weight sets to provide different signal probability profiles. It can achieve the desired fault coverage with a reasonable test length, see, J. A. Waicukauski and E. Lindbloom, "Fault Detection Effectiveness of Weighted Random Patterns," *Proc. of ITC*, pp.245–255, 1988, I. Pomeranz and S. M. Reddy, "3-weight Pasudo-random Test Generation Based on A Deterministic Test Set for Combinational and Sequential Circuits," *IEEE Trans. on CAD*, vol. 24, pp. 1050–1058, July 1993; M. Bershteyn, "Calculation of Multiple Sets of Weighted Random Testing," *Proc. of ITC*, pp. 1031–1040, October 1993; R. Kapur, S. Patil, T. J. Snethen, and T. W. Williams, "A Weighted Random Pattern Generation System," *IEEE Trans. on CAD*, vol. 15, no. 8, pp. 1020–1025, August 1996. However, if the number of weight set is large, storage and extra hardware required for the pattern generator becomes costly. Instead of providing different signal probability profiles solely from the test pattern generator, it is found that under the PSBIST architecture, test patterns with different signal probability profiles can be generated by changing the test application scheme. Specifically, using multiple capture cycles after each scan sequence results in different profiles for patterns in the scan flip-flops.

Before further discussion, it is desirable to define the following terms.

A scan cycle is the period in which a test pattern is scanned into (or the response is shifted out of) the scan chains. If the length of the longest scan chain is l, then one scan cycle corresponds to l clock cycles.

A functional cycle is the period between two scan cycles. If we use k capture cycles per scan, then one functional cycle corresponds to k clock cycles.

A test cycle is one scan cycle immediately followed by one functional cycle.

A graphical representation of the entire test procedure and one test cycle is shown in FIG. 2. Consider the example in FIG. 3: A, B and C are the primary inputs and their signal probabilities are 0.5 assuming they are driven by an LFSR. PSI is the pseudo-input driven by the scan flip-flop FF. During the scan cycle, the values appeared at PSI are random, therefore, its signal probability is 0.5. If only one capture cycle is applied after each scan sequence, the signal probability of PSI remains 0.5 in the functional cycle because its value is derived from the scan chain. As a result, only one signal probability profile is produced using one capture cycle per scan. Notice that at the end of the scan cycle, the signal probability of F is 0.9375. If we use two capture cycles after the scan cycle, the value of F will be latched into FF after the first capture cycle and thus the signal probability of PSI changes to 0.9375 at the second capture cycle. Consequently, two profiles are generated at PSI during the functional cycle.

In this example, the effects of using two capture cycles per scan are the following. At the second capture cycle:

Faults $A_{s/1}$, $B_{s/1}$, and $C_{s/1}$ become more observable (side input PSI has a greater chance of being a non-controlling value).

Fault $F_{s/1}$ becomes easier to be activated (signal probability decreases from 09375 to 0.8828125).

Fault $PSI_{s/1}$ becomes harder to be activated (signal probability increases from 0.5 to 0.9375).

This result suggests that the optimal number (k) of capture cycles vary from one fault to another. To achieve the best test result, a set of k's needs to be applied during the entire test. Thus, it may be desirable to divide the entire test process into multiple test sessions with a different k in each session. Using multiple test sessions has shown to be effective for test point insertion, see N. Tamarapalli and J. Rajski, "Constructive Multi-Phases Test Point Insertion for Scan-Based BIST," *Proc. of ITC*, pp. 649–658, October 1996. In N. Tamarapalli and J. Rajski, "Constructive Multi-Phases Test Point Insertion for Scan-Based BIST," *Proc. of ITC*, pp. 649–658, October 1996, different subsets of control points are activated in different test sessions and each subset of control points only targets on a subset of faults. Here, instead of adding test points to increase the random testability of the CUT, we explore different test application schemes to be used in different test sessions. Each test session also only targets on a subset of faults.

In addition, it has been observed that under the PSBIST architecture, the test quality can be improved by increasing the observability of the scan flip-flops' data inputs, see H.-C. Tsai, S. Bhawmik, and K.-T. Cheng, "An Almost Full-scan BIST Solution—Higher Fault Coverage and Shorter Test Application Time," *Proc. of ITC*, pp. 1065–1073, October 1998. Using multiple capture cycles per scan increases the chance of latching the fault effects thus increases the possibility of observing them at the primary outputs through functional logic during the functional cycle.

Implementing multiple capture cycles per scan only requires a minor modification to the BIST controller. In PSBIST, it is possible to adjust the mode switch signal of scan flip-flops to put them in the functional mode for multiple clock cycles. The area overhead incurred by this modification is negligible comparing to the original single capture cycle per scan scheme.

C. Multiple Test Sessions With Multiple Capture Cycles

In this section, a testability computation model is introduced to find the detection probability of a fault using multiple capture cycles per scan. Based on this information, a procedure is proposed to find the required number of test sessions and the corresponding number of capture cycles per scan in each session for achieving the highest possible test quality.

(i) Testability Computation

Under stuck-at fault model, the detection probability $Pd_i$ of a fault i can be estimated by one of following two equations:

$$Pd_{s/0} = C_s \cdot O_s \text{ for stuck- at } -0 \text{ fault at signal s;} \quad (1)$$

$$Pd_{s/1} = (1-C_s) \cdot O_s \text{ for stuck- at } -1 \text{ fault at signal s;} \quad (2)$$

where $C_s$ and $O_s$ are 1-controllability and observability of signal s, respectively. They can be estimated very efficiently using COP, see F. Brglez, "On Testability of Combinational Networks," *Proc. of ISCAS*, pp. 221–225, May 1984. Note that COP can only be applied to a combinational circuit or a sequential circuit with only self loops in its sequential graph without excessive iterations, see K.-T. Cheng and C.-J. Lin, "Timing-Driven Test Point Insertion for Full-Scan and Partial-Scan BIST," *Proc. of ITC*, pp. 506–514, October 1995. However, the CUT is sequential during the functional cycle, thus computing COP testability measures of the CUT in the functional cycle can be costly because the iterations may not converge quickly. Fortunately, the length of the functional cycle is fixed and relatively small in this application. By dividing one test cycle into multiple phases, it is possible to calculate the testability measures using the original COP method with proper boundary conditions (controllabilities of the inputs and observabilities of the outputs).

FIG. 4(a) shows a scan circuit where the primary inputs and outputs are denoted as PI and PO, respectively. Each scan flip-flop contributes a pseudo-input (PSI and a pseudo-output (PSO). Assuming k capture cycles per scan is used, the entire test cycle can be divided into four phases as shown in FIG. 4(b). The $C_s$ and $O_s$ are computed with different boundary conditions in different phases. PIs continuously receive random patterns, thus the controllability of a PI, cntl(PI) in Column 3 of FIG. 4(b) is 0.5 for all four phases. The observability of a PO, obs(PO) in Column 5 of FIG. 4(b) is always 1 because the values at Pos are observed all the time. The controllability of a PSI, cntl(PSI) in Column 4, and the observability of a PSO, obs(PSO) in Column 6, are different in different phases. The first phase is the first l-1 clock cycles of the scan cycle. In this period, the PSI receives random patterns, thus cntl(PSI) is set to 0.5. Meanwhile, the responses at the PSOs are not captured, therefore obs(PSO) is 0. The second phase is the last cycle of the scan cycle. In this period, the cntl(PSI) is set to 1.5. Meanwhile, the responses at the PSOs are not captured, therefore obs(PSI) is set to 0.5. Meanwhile, the responses at the PSOs are not captured, therefore obs(PSO) is 0. The second phase is the last cycle of the scan cycle. In this period the cntl(PSI) is still 0.5 because the circuit is in the scan mode. Meanwhile, at the end of this phase, the scan chains start to capture the circuit responses. The captured response will be observed in the following cycles through the outputs of the scan flip-flops (PSIs). Therefore obs(PSO) is set to the corresponding obs(PSO) in the next clock cycle. Staring from the third phase, the patterns at PSIs are the responses captured at PSOs in the previous clock cycle for both phases 3 and 4. Similar to phase 2, the obs(PSO) in phase 3 is the equal to the corresponding obs(PSI) in the previous clock cycle. Finally, at the end of the last phase (phase 4), the scan chains will perform k-th (the last) capture and the captured responses will eventually be observed at the outputs of scan chains. Thus the obs(PSO) is 1. Once the proper cntl(PSI) and obs(PSO) in each phase are known, $C_s$ and $O_s$ for every signal s can be computed accordingly using the original COP method.

Figure 5:
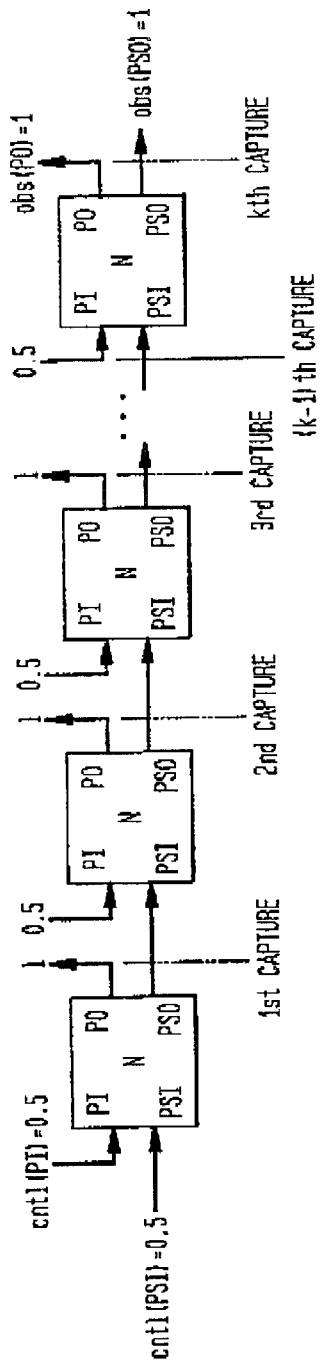
FIG. 5 illustrates the circuit of FIG. 4A after time frame expansion.

This testability computation model can also be illustrated using a time frame expansion model as shown in FIG. 5. Assuming applying k capture cycles per scan, the number of time frames required to be expanded is k (1 for each clock cycle in the functional cycle). This expanded circuit is combinational thus original COP method can be applied directly. The controllabilities are computed from the inputs of the first copy of the circuit (the leftmost one in FIG. 5) toward the k-th copy of the circuit (the rightmost one in FIG. 5). Similarly, the observabilities are computed backward from the outputs of the k-th copy of the circuit toward the inputs of the first copy.

(ii) Finding The Optimal Number of Capture Cycles For Each Fault

After computing the COP testability measures, it is possible to find the detection probability of the fault during the functional cycle using the following equation:

$$Pd_i^{func,k} = 1 - \prod_{j=1}^{k}(1-Pd_i^j) \quad (3)$$

In Equation 3, $Pd_i^{func,k}$ is the detection probability of fault i in the functional cycle with k capture cycles per scan, and $Pd_i^j$ is the detection probability of fault i at the j-th capture cycle. $Pd_i^j$ is computed using Equation (1) or (2). By neglecting detecting faults in the scan cycle, $Pd_i^{func,k}$ approximates the detection probability of fault i in one test cycle. Given two different k's, $k_1$ and $k_2$, it is possible to easily compute $Pd_i^{func,k}{}_1$ and $Pd_i^{func,k}{}_2$ for each fault i. However, it would not be appropriate to compare them directly for deciding the optimal k value for fault i. This is because different k's mean there are different numbers of clock cycles in one test cycle. Therefore, we normalize $Pd_i^{func,k}$ by dividing it by the number of clock cycles in one test cycle, i.e. 1/l+k, where 1 is the length of the scan chain. For each fault i, it is possible to compare $Pd_i^{func,k}$/l+k for different k's and the best k for fault i is the one having the largest $Pd_i^{func,k}$/l+k.

(iii) Determining Test Scheme

Figure 6:
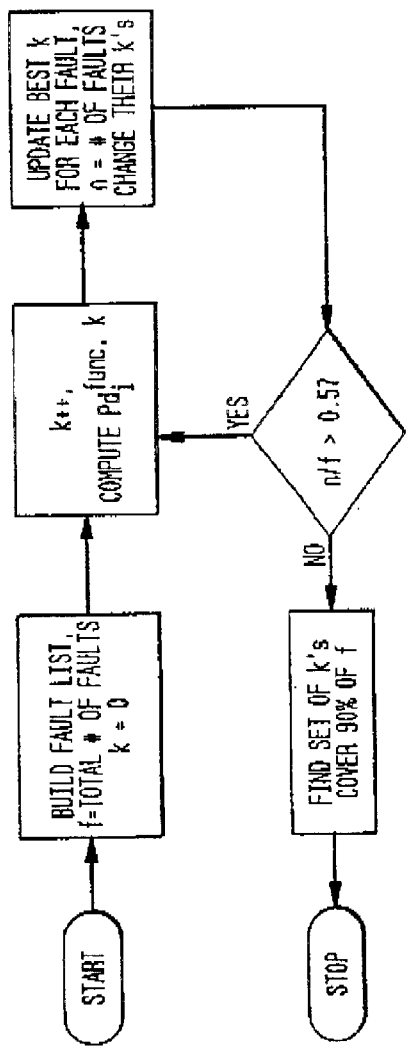
FIG. 6 illustrates in a schematic flow diagram form the technique for finding the number of test sessions and corresponding k.
Figure 7A:
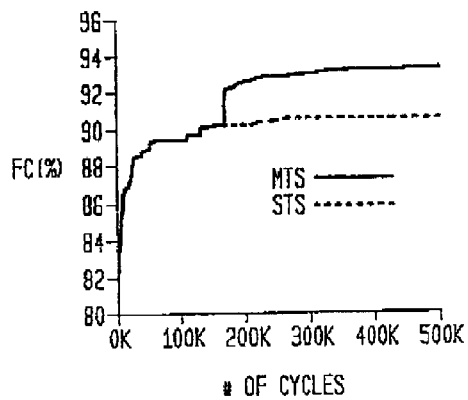
FIGS. 7A–7D respectively describe the fault coverage curves for the following circuits; s15152, s3330, s38417 and s38584.
Figure 7B:
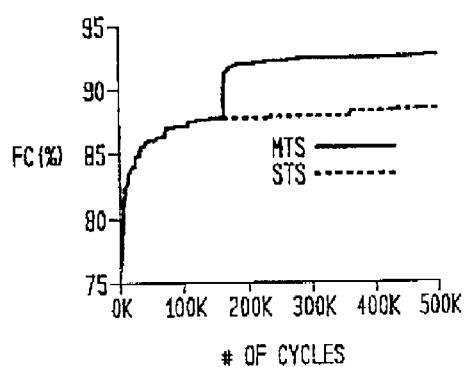
Figure 7C:
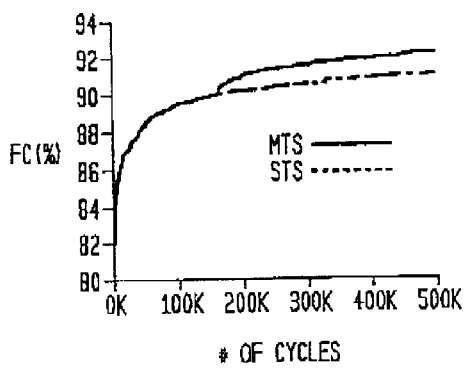
Figure 7D:
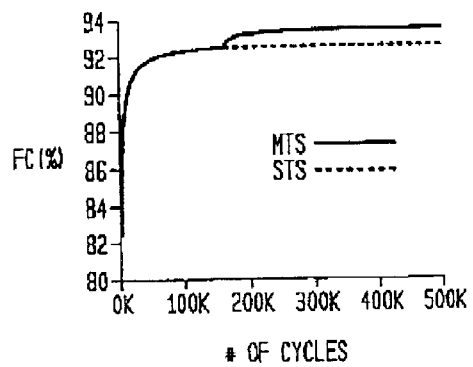

With metric $Pd_i^{func,k}$/l+k, a procedure is proposed to find the optimal number of test sessions and the corresponding number of capture cycles per scan in each session for a circuit as shown in FIG. 6. Note that the metric for determining the optimal k (i.e. $Pd_i^{func,k}$/l+k) for a fault is derived by neglecting the chance of detecting it in the scan cycle. Thus, only faults that are hard-to-detect during the scan cycle should be considered in this procedure. To identify these faults, it is desirable to first compute COP measures of the circuit in scan cycle. Faults associated with those signals which have zero observabilities can never be detected in the scan cycle and thus must be targeted in the functional cycle. In addition, it is desirable to also include faults with very low detection probabilities in the scan cycle, say $10^{-10}$, into the fault list. Finally, it is desirable to record the total number of considered faults (f). After that, the procedure becomes an iterative process. At each iteration, k is first incremented (initially set to 0) and then the corresponding $Pd_i^{func,k}$ is computed. The new $Pd_i^{func,k}$ is normalized and compared with the previous recorded best normalized $Pd_i^{func,k}$ to determine if the best k value of fault i should be updated. After updating k for each fault, the number (n) of faults which change their best ks is recorded. Because having too many test sessions may cause non-trivial area overhead on the BIST controller, thus the iteration continues only if a significant fraction of the considered faults change their best k values. In the experiment the threshold is set to 50%, i.e. n/f>0.5. Once the iterative process stops, the best k value of each following fault is determined and a fault is covered by $k_1$ if its best k value is $k_1$. After that, a small set of k's which covers a pre-determined percentage of considered faults is selected. This pre-determined percentage should cover most of the considered faults. In the following experiment, it is set to 90%. Choosing a higher percentage may not be cost-effective because the increased area overhead for the extra test sessions is only devoted to a small number of faults (less than 10% in this case). Finally, the number of test sessions is equal to the number of k's selected; the corresponding numbers of capture cycles are these k's.

D. Experimental Results

The algorithm was implemented and experiments conducted on ISCAS89 benchmark circuits.

An industrial tool, psb2, is used to automatically insert the BIST circuitry. psb2 is a product of Lucent Technologies. While adding the BIST capability, the length of the longest scan chain was set to 10 and a 21-stage LFSR used as the test pattern generator (19-stage LFSR for s953). The scanned circuits are fault simulated for 500K clock cycles using both single test session (STS)—one capture cycle per scan—and multiple test sessions (MTS) schemes. Note that fault simulation is done by issuing commands to the BIST controller so that the circuit tests itself. Therefore, the fault list contains faults not only in the CUT but also in the added BIST circuitry. To ensure a fair fault coverage comparison, identical fault lists were kept for both STS and MTS schemes by excluding faults associated with the extra circuitry for MTS in the BIST controller.

TABLE 1

Multiple Test Sessions with Multiple Capture Cycles per Scan

| Circuit | # of Test sessions | # of capture cycles | CPU time (s.) |
|---|---|---|---|
| s953 | 4 | 1, 3, 4, 5 | 14.9 |
| s1423 | 2 | 1, 2 | 14.9 |
| s1512 | 3 | 1, 2, 3 | 15.2 |
| s3271 | 3 | 2, 3, 4 | 17.9 |
| s3330 | 4 | 1, 2, 3 | 17.4 |
| s3384 | 3 | 2, 3, 4 | 18.0 |
| s4863 | 3 | 1, 4, 5 | 20.3 |
| s5378 | 2 | 1, 2, 3 | 19.2 |
| s6669 | 3 | 2, 4, 5 | 23.2 |

TABLE 1-continued

Multiple Test Sessions with Multiple Capture Cycles per Scan

| Circuit | # of Test sessions | # of capture cycles | CPU time (s.) |
|---|---|---|---|
| s9234.1 | 3 | 1, 2, 3, 4 | 32.4 |
| s15850.1 | 3 | 1, 2, 3 | 47.0 |
| s35932 | 3 | 1, 2, 3 | 228.3 |
| s38417 | 3 | 1, 2, 3 | 177.5 |
| s38584 | 3 | 1, 2, 3 | 225.4 |

The number of test sessions and the corresponding number of capture cycles per scan were first determined using the algorithm. The results are shown in Table 1. For example, circuit s3271 requires 3 test sessions with 2, 3, and 4 capture cycles per scan in each test session, respectively. Given a total number of clock cycles for BIST, simply distribute them into three equal-test-length sessions. The run time to determine this test scheme is 17.9 seconds on a Sun Sparc-Station 20. The BIST controller is then modified accordingly to perform the desired operations—1, 2, 3 and 4 capture cycles per scan.

MTS depends only on the number of test sessions and the maximum number of capture cycles per scan. For larger circuits, the overall area overhead of MTS is similar to that of STS.

The fault coverage curves of some circuits are shown in FIG. 7. Unlike the relatively smooth curves using STS, using MTS creates "jumps" at the beginning of a new test session. The "magnitude" of the "jump" is significant at the beginning of the 2nd test session and then diminishes afterwards. This diminishing phenomenon may be caused by the greedy nature of determining the k value for each fault. Given two k values, $k_1$ and $k_2$, we say $k_1$ is better than $k_2$ for fault i if $Pd_i^{func,k_1}/1+k_1$ is greater than $Pd_i^{func,k_2}/1+k_2$. However, if $|Pd_i^{func,k_1}/1+k_1 - Pd_i^{func,k_2}/1+k_2|$ is relatively small, both $k_1$ and $k_2$ may work equally well for fault i. In this case, if both $k_1$ and $k_2$ are included in the final test application scheme and $k_1$ is applied before $k_2$, then faults which are intended to be targeted in the session with $k_2$ capture cycles per scan may also likely be detected in the session with k1 capture cycles per scan.

TABLE 2

Fault Stimulation Results and Area Overheads

| | Fault Coverage (%) | | | Area Overhead (%) | | | | |
|---|---|---|---|---|---|---|---|---|
| | 500 K clock cycles) | | Original | | Other BIST circuitry | | Overall | |
| Circuit | Single | Multiple | (grid count) | Scan | Single | Multiple | Single | Multiple |
| s953 | 96.63 | 99.84 | 1687 | 10.3 | 77.7 | 91.7 | 88.0 | 102.0 |
| s1423 | 96.81 | 98.50 | 3339 | 13.3 | 42.1 | 45.7 | 55.4 | 59.0 |
| s1512 | 91.98 | 95.16 | 3220 | 10.6 | 46.5 | 52.0 | 57.1 | 62.5 |
| s3271 | 98.94 | 99.84 | 6656 | 10.5 | 22.8 | 25.4 | 33.2 | 35.9 |
| s3330 | 88.38 | 92.58 | 7513 | 10.5 | 21.7 | 24.0 | 32.2 | 35.5 |
| s3384 | 96.89 | 97.15 | 8389 | 13.1 | 20.5 | 22.6 | 33.6 | 35.7 |
| s4863 | 97.16 | 97.42 | 9698 | 6.4 | 17.7 | 19.5 | 24.1 | 26.0 |
| s5378 | 96.47 | 96.68 | 10094 | 10.6 | 16.2 | 17.9 | 26.9 | 28.7 |
| s6669 | 99.72 | 99.89 | 14318 | 10.0 | 14.6 | 15.8 | 24.6 | 25.9 |
| s9234.1 | 86.31 | 86.46 | 18330 | 6.9 | 9.0 | 10.5 | 15.9 | 17.2 |
| s15850.1 | 87.19 | 88.23 | 134290 | 9.3 | 6.3 | 6.8 | 15.6 | 16.2 |
| s35932 | 89.02 | 89.65 | 77166 | 13.4 | 2.4 | 2.6 | 15.8 | 16.0 |
| s38417 | 91.82 | 93.12 | 84763 | 11.6 | 2.0 | 2.2 | 13.6 | 13.8 |
| s38584 | 93.51 | 94.47 | 79022 | 10.4 | 1.9 | 2.1 | 12.4 | 12.6 |
| ave. | 93.63 | 94.93 | 25918 | 11.0 | 6.5 | 7.1 | 17.5 | 18.1 |

The fault simulation results and area information are shown in Table 2. The 2nd and 3rd columns are the fault coverages using STS and MTS schemes, respectively. Both schemes run the same number of clock cycles (500K) for BIST. Although the fault coverage improvement varies, using MTS gives us higher fault coverages in all cases. An average 94.93% fault coverage was determined with MTS scheme as opposed to 93.63% with STS scheme. The area information in Table 2 does not include routing area. The circuit size without BIST capability is in Column 4 in unit of grid using Lucent's 0.5$\mu$ CMOS standard cell library. The area overhead is divided into scan and other BIST circuitry overheads. Both are normalized by dividing them by the original circuit size. Scan overhead in Column 5 is the cost of converting flip-flops into scan flip-flops. This part is identical for both test schemes. Other BIST circuitry overhead includes BIST controller, TPG, ODC and multiplexers. Because STS and MTS differ only in the BIST controller, this part is slightly different for STS and MTS schemes and shown in Columns 6 and 7, respectively. The last 2 columns show the overall area overhead. The extra area overhead of

TABLE 3

Test length comparison of single and multiple test sessions.

| | Single | | Multiple | | Test length |
|---|---|---|---|---|---|
| Circuit | FC (%) | Cycle | FC (%) | Cycle | reduction[2] (%) |
| s953 | 96.63 | 214025 | 96.79 | 125025 | 41.6 |
| s1423 | 96.81 | 127712 | 96.81 | 127712 | 0 |
| s1512 | 91.98 | 252737 | 91.98 | 166700 | 34.0 |
| s3271 | 98.94 | 381512 | 98.94 | 13762 | 96.4 |
| s3330 | 88.38 | 476637 | 88.91 | 166687 | 65.0 |
| s3384 | 96.89 | 498350 | 96.89 | 31350 | 93.9 |
| s4863 | 97.16 | 429337 | 97.24 | 359287 | 16.3 |
| s5378 | 96.47 | 326137 | 96.47 | 217787 | 33.2 |
| s6669 | 99.72 | 79537 | 99.72 | 1625 | 98.0 |
| s9234.1 | 86.31 | 496900 | 86.32 | 423675 | 14.7 |
| s15850.1 | 87.19 | 440437 | 87.19 | 254337 | 42.3 |
| s35932 | 89.02 | 2850 | 89.02 | 2850 | 0 |
| s38417 | 91.82 | 498375 | 91.82 | 204400 | 59.0 |

TABLE 3-continued

Test length comparison of single and multiple test sessions.

| | Single | | Multiple | | Test length |
|---|---|---|---|---|---|
| Circuit | FC (%) | Cycle | FC (%) | Cycle | reduction$^2$ (%) |
| s38584 | 93.51 | 455162 | 93.51 | 167187 | 63.3 |
| Ave. | 93.63 | 412836 | 93.66 | 154504 | 60.9 |

Table 3 shows comparison of test length using STS and MTS. Here the target fault coverage is set to be the final fault coverage of STS. The earliest clock cycle is then recorded at which the target fault coverage is reached for both STS and MTS. Columns 2 and 3 show the final fault coverages and corresponding number of clock cycles for STS; Columns 4 and 5 are the results of MTS. With comparable fault coverages, the test length reduction (in %) using MTS is calculated and shown in the last-column ([(the earliest cycle for STS)—(the earliest cycle for MTS)]/(the earliest cycle for STS)). The reductions are very significant for many circuits. The average test length reduction is approximately 60.9%. Note that the technique did not obtain any improvement for s1423 and s35932. This is because the first test session for both circuits uses one capture cycle per scan which is the same as STS. Moreover, the target fault coverages (96.81% for s1423 and 89.02% for s35932) are reached in the first test session. Therefore, even though the final fault coverages (after 500K clock cycles) are higher with MTS, they are not reached until the later test sessions. This indicates the timing to switch test sessions greatly affects the test length.

TABLE 4

Results after adding test points

| | Single | | Multiple | |
|---|---|---|---|---|
| Circuit | # of TPs | FC (%) | # of TPs | FC (%) |
| s953 | 1 | 98.61 | 0 | 99.84 |
| s1423 | 2 | 98.15 | 0 | 98.50 |
| s1512 | 6 | 98.16 | 4 | 99.21 |
| s3330 | 30 | 98.28 | 5 | 98.71 |
| s3384 | 1 | 98.97 | 1 | 99.17 |
| s4863 | 5 | 98.03 | 3 | 98.75 |
| s5378 | 25 | 96.78 | 15 | 96.81 |
| s9234.1 | 30 | 94.44 | 25 | 94.50 |
| s15850.1 | 30 | 95.63 | 25 | 95.96 |
| s35932 | 10 | 99.44 | 5 | 99.94 |
| s38417 | 30 | 97.11 | 15 | 97.70 |
| s38584 | 30 | 96.66 | 15 | 96.87 |

Although using the proposed MTS scheme increases the fault coverage, it may still require other DFT techniques to obtain a desired level of fault coverage. Therefore, the proposed approach was combined with a test point selection algorithm (see, H.-C. Tsai, K.-T. Cheng, C.-J. Lin, and S. Bhawmik, "A Hybrid Algorithm for Test Point Selection for Scan-Based BIST," *Proc. of DAC*, pp. 478–483, June 1997) to study the effects of using MTS on the required number of test points. Test points are added to circuits which have fault coverages lower than 98% with STS. Note that the test points are selected by assuming obs(PSO) equals to 1. This represents the case of applying infinite number of test cycles. Thus, the selected test points should improve the fault detection in every test cycle regardless the number of capture cycles used in each test cycle. It is expected that the proposed test application scheme can reduce the number of test points to achieve a given fault coverage. The results in Table 4 validate this point. MTS always obtains higher fault coverages than STS does with a fewer number of test points. The difference in the number of test points becomes much more significant for larger circuits. This is because when the circuit reaches a high fault coverage level, the undetected faults tend to be scattered over the entire circuit. Thus, it usually requires a separate test point to target each one of them. If extra faults can be detected with the proposed test application scheme, then the number of required test points can be drastically reduced. Furthermore, it reduces the chance of causing performance degradation due to the test points.

E. Conclusions

A general test application scheme is proposed to improve the test quality of the scan-based BIST. Instead of capturing the responses into the scan chain once every scan cycle, capturing the responses multiple times can increase the chance of detecting a subset of faults. A testability computation model was introduced for finding the detection probability of a fault in the functional cycle. A metric was developed to find the optimal number of capture cycles per scan for each fault. The use of multiple test sessions with multiple capture cycles per scan is proposed for better test quality. A procedure is used to determine the best test scheme for a given circuit. Experimental results show significantly improvement on both fault coverage and test length. The experimental results also indicates that the proposed test application scheme and test point insertion are complementary—a higher fault coverage is achieved with fewer test points. The difference in the number of test points is more significant for larger circuits. The timing of switching test sessions greatly influences the test length and this issue is currently under investigation.

We claim:

1. A method for optimizing the detection of faults in a Circuit User Test (CUT) applied to a circuit characterized by a combinational part and a sequential part including a scan chain of sequentially scannable memory elements ($FF_1$, $FF_2$, $FF_3$, etc.), said method comprising:

a) scanning a test pattern into the scan chain of said circuit during a scan cycle corresponding to l clock cycles, where l is the length of the scan chain;

b) applying to the circuit k capture cycles corresponding to k clock cycles, wherein the combinational part and the scan chain are clocked k times, where $k \geq 2$, and, during each capture cycle, one or more responses of the combinational part are latched onto the scan chain; and c) shifting the results of the test of steps (a) and (b) out of the scan chain.

2. The method of claim 1, wherein step (c) comprises:

(c1) repeating step (a); and (c2) repeating step (b) with a different k value.

3. The method of claim 2, wherein step (c1) comprises repeating step (a) with a different scan pattern.

4. The method of claim 2, wherein step (c) further comprises:

(c3) choosing a number of repetitions; and (c4) determining the different k value for each repetition to optimize the detection of faults during the CUT.

5. The method of claim 4, wherein, for steps (c3) and (c4), the number of repetitions and k are determined based on detection probability of individual stuck-at faults and a desired percentage of fault coverage at conclusion of the CUT.

6. The method of claim 5, wherein the detection probability ($Pd_i^{func,k}$) of an i-th individual stuck-at fault is computed as $$Pd_i^{func,k} = 1 - \prod_{j=1}^{k}(1-Pd_i^j)$$

where $Pd_i^j$ is detection probability of the i-th individual stuck-at fault at a j-th capture cycle and $1 \leq j \leq k$.

7. The method of claim 1, further comprising building a fault list based on the results of the test of steps (a)–(c).

8. The method of claim 7, further comprising selecting a set of test points in the circuit based on the fault list to improve fault coverage.

9. The method of claim 1, wherein the time period between the end of step (a) and the beginning of step (c) is k clock cycles.

10. The method of claim 1, wherein step (b) starts at the next clock cycle after the end of step (a).

11. The method of claim 10, wherein the time period between the end of step (a) and the beginning of step (c) is k clock cycles.

12. A method for optimizing the detection of faults in a Circuit User Test (CUT) applied to a circuit characterized by a combinational part and a sequential part including a scan chain of sequentially scannable memory elements ($FF_1$, $FF_2$, $FF_3$, etc.), said method comprising:

a) scanning a test pattern into the scan chain of said circuit during a scan cycle corresponding to l clock cycles, where l is the length of the scan chain;

b) applying to the circuit k capture cycles corresponding to k clock cycles, where k≧2, wherein, during each capture cycle, one or more responses of the combinational part are latched onto the scan chain; and c) shifting the results of the test of steps (a) and (b) out of the scan chain.

13. The method of claim 12, wherein step (c) comprises:

(c1) repeating step (a); and (c2) repeating step (b) with a different k value.

14. The method of claim 13, wherein step (c1) comprises repeating step (a) with a different scan pattern.

15. The method of claim 13, wherein step (c) further comprises:

(c3) choosing a number of repetitions; and (c4) determining the different k value for each repetition to optimize the detection of faults during the CUT.

16. The method of claim 15, wherein, for steps (c3) and (c4), the number of repetitions and k are determined based on detection probability of individual stuck-at faults and a desired percentage of fault coverage at conclusion of the CUT.

17. The method of claim 16, wherein the detection probability ($Pd_i^{func,k}$) of an i-th individual stuck-at fault is computed as $$Pd_i^{func,k} = 1 - \prod_{j=1}^{k}(1-Pd_i^j)$$

where $Pd_i^j$ is detection probability of the i-th individual stuck-at fault at a j-th capture cycle and $1 \leq j \leq k$.

18. The method of claim 12, wherein the time period between the end of step (a) and the beginning of step (c) is k clock cycles.

19. The method of claim 12, wherein step (b) starts at the next clock cycle after the end of step (a).

* * * * *